(12) United States Patent
Deguchi

(10) Patent No.: US 6,800,805 B2
(45) Date of Patent: Oct. 5, 2004

(54) NOISE SUPPRESSING STRUCTURE FOR SHIELDED CABLE

(75) Inventor: Masaru Deguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/726,614

(22) Filed: Dec. 4, 2003

(65) Prior Publication Data

US 2004/0118582 A1 Jun. 24, 2004

(30) Foreign Application Priority Data

Dec. 19, 2002 (JP) ........................................ 2002-367932

(51) Int. Cl.[7] .............................................. H05K 9/00
(52) U.S. Cl. ................................ 174/35 GC; 439/578; 439/927; 174/35 C
(58) Field of Search ....................... 174/35 R, 35 GC, 174/35 C; 439/578, 927

(56) References Cited

U.S. PATENT DOCUMENTS

| | | | | |
|---|---|---|---|---|
| 4,896,000 A | * | 1/1990 | Procter et al. | 174/74 R |
| 5,410,102 A | * | 4/1995 | Guiol et al. | 174/35 C |
| 5,631,443 A | * | 5/1997 | Scrimpshire et al. | 174/35 R |
| 5,886,294 A | * | 3/1999 | Scrimpshire et al. | 174/35 R |
| 6,583,352 B2 | * | 6/2003 | Fukushima et al. | 174/35 R |

FOREIGN PATENT DOCUMENTS

JP  2001-298295  10/2001

* cited by examiner

Primary Examiner—Hung V. Ngo
(74) Attorney, Agent, or Firm—Whitham, Curtis & Christofferson, PC

(57) ABSTRACT

A low-cost noise suppressive technology using a general connector, reliably grounding to a shielding sheath of shielded cable at a low impedance by simple structure. The structure comprises conductive shielding covers attached to a chassis to enclose both sides of the second connector of non-shielded type at a tip of the shielded cable connected to the first connector mounted on the chassis and are fixed in a state to mate each other. Gaskets made of elastic material are respectively attached to inside of each shielding covers and made of conductive material being in electrical contact with the shielding cover. The gaskets are elastically contacted and conducted with the shielding sheath at an exposed portion of the shielded cable when the shielding covers are attached to the chassis to enclose the second connector and are fixed in the state to mate each other.

7 Claims, 2 Drawing Sheets

__NOISE SUPPRESSING STRUCTURE FOR SHIELDED CABLE__

FIELD OF THE INVENTION

The present invention relates to a noise suppressing structure for shielded cable, and in particular to a noise suppressing technology for shielded cable to ground a shielding sheath of the shielded cable.

BACKGROUND OF THE INVENTION

Conventionally it is widely known that shielded cable is used for connecting cable within a system to suppress the occurrence of EMI (electromagnetic interference) in all kinds of electronic equipment, particularly in communication equipment.

The introduction of the shielded cable may very effectively suppress the occurrence of EMI. However in connecting to a circuit board within equipment and using a connector, it is unsatisfactory to ground a shielding sheath of the shielded cable or it is difficult to realize shielding of the connector itself.

When the grounding of the shielding sheath or the shielding of the connector itself is insufficient like this, a radiative source of internal noise is introduced. When there is no grounding of a shielding sheath at a low impedance, for example, for parts comprising chassis of electronic equipment, the shielding sheath has an isolated state from ground due to an impedance mismatch and the shielding sheath has a possibility of operating as noise radiative antenna.

For the connector of such shielded cable, a special connector for the shielded cable is provided, so that the reduction of contacting impedance with the shielding sheath is realized by keeping continuity between the shielding sheath of shielded cable and the case of the connector grounded to a part of the chassis.

However such special connector has a limited selection and the number of used signal lines or the outer diameter is restricted. Consequently a proper connector cannot be selected for using shielded cable or the special connector becomes costly.

On the other hand, for example Patent Document 1 discloses an electromagnetic noise reducing structure at an opening to introduce a cable. A shielding structural component with conductive cloth to insert and to fix an end of a connecting cable is used. An end of the shielding structural component is attached to a housing of equipment and electrically connected to the housing. An end of additional shielding structural component is attachable or detachable to the other end of the shielding structural component in response to the intensity of electromagnetic noise transmitting on the cable.

Patent Document 1: Japanese Patent Kokai Publication JP-P2001-298295A (page 3, page 4, FIG. 19 and FIG. 3)

SUMMARY OF THE DISCLOSURE

In such electromagnetic noise reducing structure, since the connector itself is not a special component but a general one, the cost may be reduced for the connector. However as for the shielding structural component, the structure increases in complexity, mounting work needs much time, and the cost is increased.

The present invention is proposed in order to overcome the above-mentioned problems in the prior art. It is therefore an object of the present invention to provide a low-cost noise suppressive technology using a general connector and having a capability of reliably grounding to a shielding sheath of shielded cable at a low impedance by a simple structure.

According to a first aspect of the present invention, there is provided a noise suppressing structure for a shielded cable in which a second connector of non-shielded type attached to a tip of the shielded cable is to be connected to a first connector to be mounted on a chassis of electronic equipment. The structure comprises a pair of conductive shielding covers which are attached to the chassis to enclose both sides of the second connector connected to the first connector and are fixed in a state to mate each other, and a pair of gaskets made of an elastic material are respectively attached to inside of each shielding cover and is formed of conductive member being in electrical contact with the corresponding shielding cover. Each gasket is elastically contacted and conducted with a portion at which a shielding sheath of the shielded cable is exposed when the shielding covers are attached to the chassis to enclose both sides of the second connector and are fixed in the state to mate each other.

When a noise suppressing structure for shielded cable is such structure, the second connector of non-shielded type connected to the first connector mounted on the chassis is enclosed and shielded by the pair of conductive shielding covers. The EMI radiation from the second connector can be suppressed by the shielding covers.

Since each gasket respectively attached to the inside of each shielding cover is elastically contacted and conducted at a low impedance with the shielding sheath at the exposed portion of the shielded cable extending from the second connector, the shielding sheath is conducted with the chassis through the gaskets and the shielding covers. Consequently the shielding sheath is grounded and at approximately the same potential to the chassis.

Thus the connector is easily attachable and reliably shielded with a simple structure and the shielding sheath of the shielded cable is grounded at a low impedance though a general connector of non-shielded type is used to connect the shielded cable.

There is a noise suppressing structure for shielded cable according to a second aspect wherein the shielding cover is made of conductive material.

In such noise suppressing structure for shielded cable, a conductive shielding cover is easily constructed since the shielding cover is made of conductive metal or plastic material mixing conductive material etc.

There is a noise suppressing structure for shielded cable according to a third aspect wherein the shielding cover has a surface made of a conductive material.

In such noise suppressing structure for shielded cable, a conductive shielding cover is easily constructed since the shielding cover is made of non-conductive plastic material and has a surface made of coated, plated or evaporated conductive material etc.

There is a noise suppressing structure for shielded cable according to a fourth aspect wherein the gaskets are arranged to stagger back and forth in a space where both of shielding covers are mated each other.

In such noise suppressing structure for shielded cable, since the shielded cable is bent in the slim shape of an S and held by the gaskets which are arranged to stagger back and forth in the space where both of shielding covers are mated each other, the conductive structural component on the surface of the gaskets is more reliably electrically in contact with the portion where a shielding sheath of the shielded cable is exposed and the contact impedance is furthermore decreased.

There is a noise suppressing structure for shielded cable according to a fifth aspect wherein at least one of the gaskets has a spacer in thickness corresponding with the outside diameter of the shielded cable and a space for other gasket is adjustable.

In such noise suppressing structure for shielded cable, since the spacer in proper thickness corresponding with the outside diameter of the shielded cable is inserted between one gasket and one shielding cover, the distance between the gaskets in the lateral direction is properly adjusted and desirable pressure being in contact with the shielded cable can be exerted on the basis of the elasticity of the gaskets.

There is a noise suppressing structure for shielded cable according to a sixth aspect wherein the first connector is mounted on a circuit board in the chassis and is exposed to exterior at the surface of the chassis.

In such noise suppressing structure for shielded cable, when the first connector is not directly mounted on the chassis but mounted on the circuit board in the chassis, the second connector connected to the first connector is enclosed by the shielding covers and the first connector can be shielded from the environment.

There is a noise suppressing structure for shielded cable according to a seventh aspect wherein the first connector is mounted on a front plate attached to a front of a circuit board installed in the chassis and is exposed to exterior at the surface of the chassis.

In such noise suppressing structure for shielded cable, when the first connector is not directly mounted on the chassis but mounted on the front plate attached to the front of the circuit board in the chassis, the second connector connected to the first connector is enclosed by the shielding covers and the first connector can be shielded from surrounding.

In such noise suppressing structure for shielded cable of the present invention, since the second connector of non-shielded type connected to the first connector mounted on the chassis side is enclosed by the pair of conductive shielding covers, the EMI radiation from the second connector is suppressed by the shielding covers.

Since each gasket is elastically contacted and conducted at a low impedance with the shielding sheath exposed at the exposed portion of the shielded cable extending from the second connector, the shielding sheath is grounded through the gaskets and the shielding covers.

Consequently the connector is easily attachable and reliably shielded with a simple structure and the shielding sheath of the shielded cable is grounded at a low impedance though a general connector of non-shielded type is used to connect the shielded cable.

PREFERRED EMBODIMENTS OF THE INVENTION

An embodiment of the present invention will be described with reference to the drawings.

The embodiment of a noise suppressing structure for shielded cable of the present invention will be described with reference to FIGS. 1 and 2.

Figure 1:
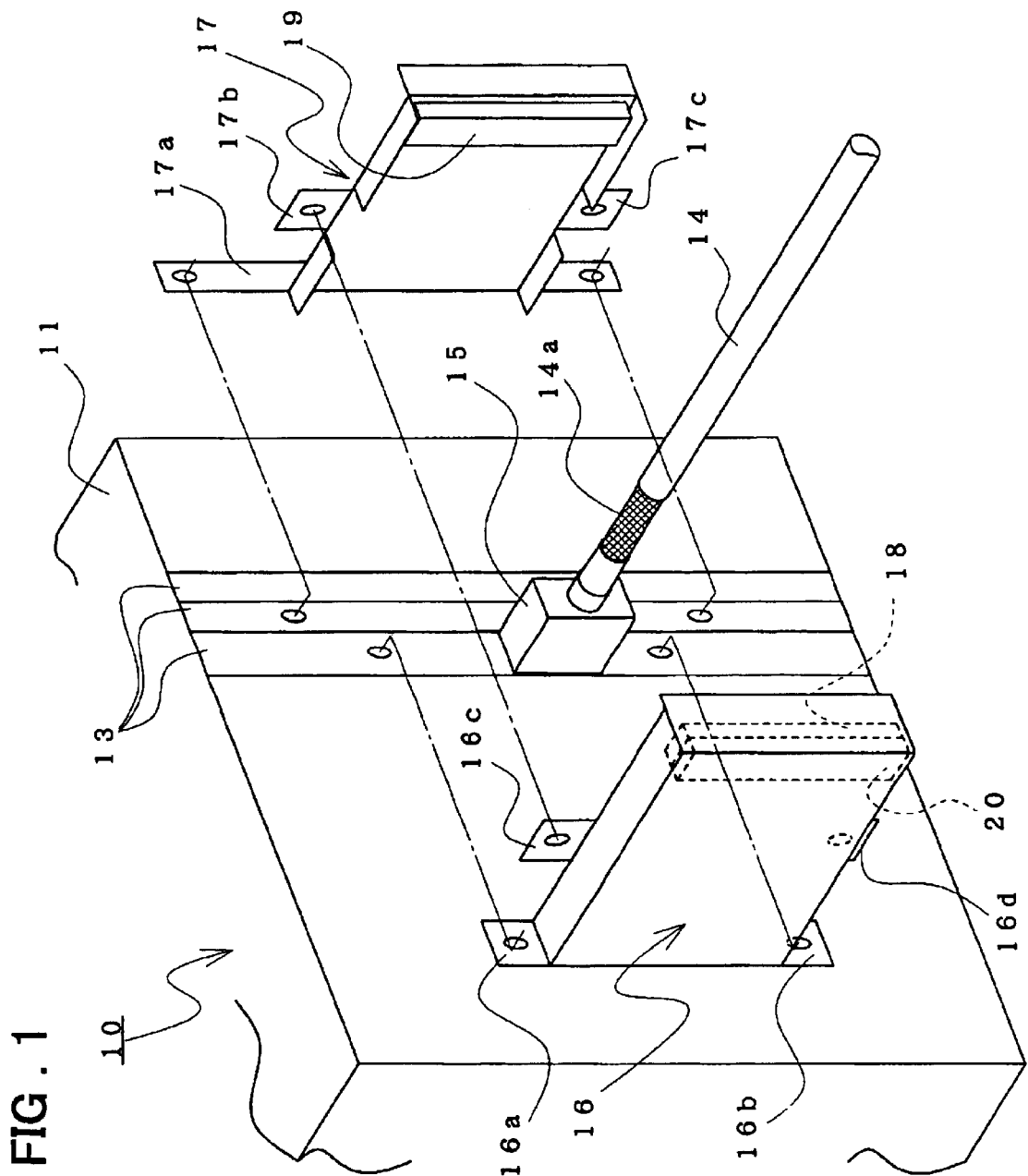
FIG. 1 is a schematic perspective view showing a noise suppressing structure for shielded cable in an embodiment of the present invention.

FIG. 1 is a block diagram showing a noise suppressing structure for shielded cable.

In FIG. 1, the noise suppressing structure 10 for shielded cable has a structure to be attached to a part of chassis 11.

Chassis 11 provides a circuit board 12 mounted on the chassis, and the circuit board 12 has a front plates 13 attached in the front of the circuit board as shown in FIG. 1. A connector 13a attached on the circuit board 12 is exposed to the exterior from an aperture of the front plate 13.

A connector 15 attached to a tip of a shielded cable 14 is connected to the connector 13a.

The circuit board 12 may be respectively attached to a plurality of mounting portions on the chassis 11. There are electronic parts and wiring patterns on the circuit board.

Front plates 13 are attached for each circuit board 12 and arranged on the front plane of the circuit board 12 which is mounted to each of three mounting portions on the chassis 11 as shown in Figs.

Only a left most front plate 13 receives the connector 13a mounted.

The shielded cable 14 in which shielding sheath is braided shield is covered by an insulating material. The shielded cable 14 has an exposed portion 14a to expose the braided shield at a part of the sheath near a tip of the shielded cable.

The connector 15 is not a special connector for the shielded cable but a general connector of non-shielded type and has no shielded structure.

The connector 15 is connected only to the left most front plate 13 with the connector 13a and is not connected to other front plates 13 having no connector 13a as shown in Figs.

The noise suppressing structure 10 for shielded cable comprises a pair of shielding covers 16 and 17 enveloping (enclosing) both sides of the connector 15, a pair of gaskets 18, 19 and a spacer 20 arranged within an inside space formed by the shielding covers 16 and 17.

The shielding covers 16 and 17 are made of a metallic material to have the shielding effect and are mounted to the front plates 13 to cover the connector 15 connected to the connector 13a on the front plate 13.

For example, the left shielding cover 16, which is formed like a low-profile rectangular parallelepiped in which the right side is open, has mounting portions 16a and 16b extended in upper and under direction from edge portions, which are opposed to the front plate 13, upside or underside of the rectangular parallelepiped. The shielding cover 16 is secured by screws, not shown, at the upside and underside of the connector 13a with the front plate 13.

On the other hand, the right shielding cover 17 is formed as a flat cover aligned at right angles with the front plate 13. The shielding cover 17 has mounting portions 17a extended in upper and under direction at the right side of edge portions which are opposed to the front plate 13. The shielding cover 17 can be secured to the front plate 13, at a position adjacent to the right side of the front plate 13, with the connector 13a, by screws not shown.

Furthermore the shielding cover 17 has projecting portions 17b and 17c, each of which is a part of upper or under margin projected in upper and under direction. Projecting portions 17b and 17c can be respectively secured to projecting portions 16c and 16d, each of which is projected in upper or under direction from right edge of upper or under surface of the shielding cover 16 and is respectively opposed to the projecting portions 17b or 17c, by screws not shown, when the shielding cover 16 and 17 are mated each other.

The shielding cover 17 has upper and under portions bent to the left direction except the projecting portions 17b and 17c. The bent portions are inserted within the shielding cover 16 when the shielding cover 16 and 17 are mated each other. Therefore the internal space formed by the shielding covers 16 and 17 is reliably shielded.

The depth of the shielding cover 17 is selected to be less than the depth of the shielding cover 16. A front end of the shielding cover 17 is bent out to the right direction.

The gaskets 18 and 19 are respectively mounted on the opposed insides of the shielding covers 16 and 17 so as to be extended in upper and under direction near the front end.

The gaskets 18 and 19 are formed to cover elastic sponge by a metallic fabric and are kept to conduct a shielding sheath of shielded cable 14 at a low impedance when the gaskets 18 and 19 are elastically contacted with the exposed portion 14a of the shielded cable 14.

The metallic fabric on the surface of the gaskets 18 and 19 are mounted to conduct with the shielding covers 16 and 17 when the gaskets 18 and 19 are mounted on the shielding covers 16 and 17.

Figure 2:
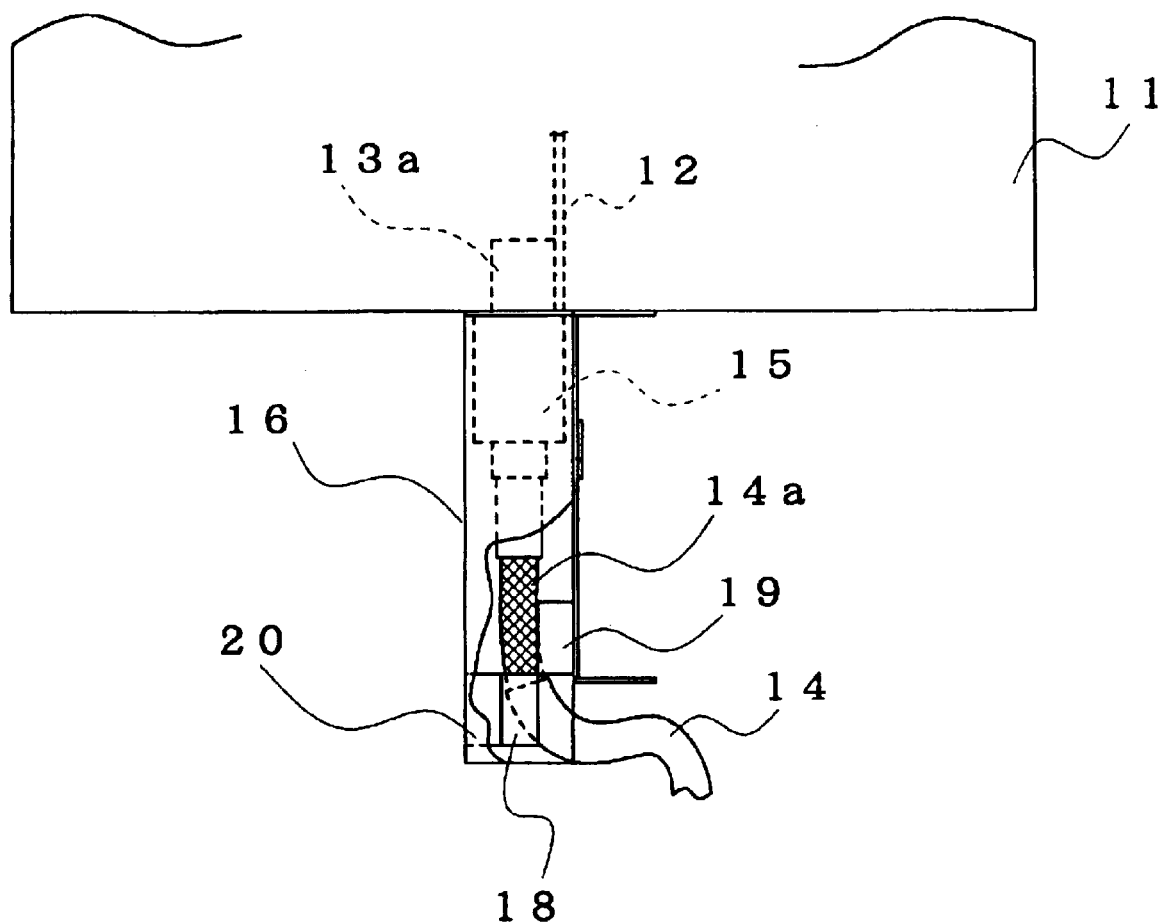
FIG. 2 is a schematic sectional view showing the noise suppressing structure for shielded cable in FIG. 1.

The gaskets 18 and 19 are arranged to stagger back and forth in the inside space formed by the shielding covers 16 and 17 as shown in FIG. 2 since each depth of the shielding covers 16 and 17 differ from one another. Consequently the shielded cable 14 caught between the gaskets 18 and 19 is held in the pressed state by the gaskets 18 and 19 staggered back and forth in the inside space formed by the shielding covers 16 and 17. The shielded cable 14 comes reliably in contact with insides of the gaskets 18 and 19, that is, the metallic fabrics on the sponge and is electrically connecting.

A spacer 20 is used to fit the gasket 18, mounted on the inside of the shielding cover 16, to outside diameter of the shielded cable 14. The spacer 20 having a variety of thickness (dimension in right and left direction) corresponding with the outside diameter of the shielded cable 14 is provided.

The space between the gasket 18 mounted on the inside of the shielding cover 16 and the gasket 19 mounted on the inside of the shielding cover 17 are appropriately kept in the state staggering back and forth in the inside space formed by the shielding covers 16 and 17. Consequently insides of the gaskets 18 and 19, that is, the metallic fabrics on the sponge come reliably in contact with the exposed portion 14a of the shielded cable 14 and are kept to conduct the shielding sheath of shielded cable 14.

Next assembly of noise suppressing structure 10 in the present embodiment will be described.

General connector 15 attached to the tip of the shielded cable 14 is connected to the connector 13a mounted on the front plate 13 attached to the front of the circuit board 12 installed in the chassis 11 in all kinds of electronic equipment. The shielded cable 14 has the exposed portion 14a to expose a part of the shielding sheath.

Mounting portions 16a and 16b of the shielding cover 16 are fixed to a front plate 13 by two screws and mounting portions 17a and 17b of the shielding cover 17 are fixed to the front plate 13 right adjacent to the front plate 13 by two screws so as to enclose the connector 15 on both sides by the shielding covers 16 and 17. Furthermore the projecting portions 16c and 16d, each of which is projected in upper or under direction of the shielding cover 16, are respectively fixed to the projecting portions 17b and 17c by two screws.

Then the shielding covers 16 and 17 are fixed to the front plates 13 and the chassis 11 to form the internal space between the shielding covers 16 and 17 when the shielding covers 16 and 17 are mated each other. The connector 15 attached to the tip of the shielded cable 14 is perfectly surrounded by the shielding covers 16 and 17.

Thus the assembly of noise suppressing structure 10 with the shielding cover 16, 17 and the shielded cable is completed.

In this case, the gaskets 18 and 19 respectively mounted on the inside of the shielding covers 16 and 17 are elastically contacted with the shielding sheath exposed at the exposed portion 14a of the shielded cable 14 based on the characteristics of sponge. The gaskets 18 and 19 are reliably electrically connecting by the metallic fabrics on the sponge.

Since the metallic fabrics conduct with the shielding covers 16 and 17 and the shielding covers 16 and 17 are mounted on the front plates 13, the shielding sheath at the exposed portion 14a conducts with the front plates 13 and the chassis 11 through the gaskets 18, 19, the shielding covers 16 and 17.

When the gaskets 18 and 19 are staggered back and forth in the inside space formed by the shielding covers 16 and 17 to come in contact with the exposed portion 14a of the shielded cable 14, the gaskets 18 and 19 are conductive with the shielding sheath of the exposed portion 14a shielded cable 14 at a low impedance. A shielding layer being at the same potential as the chassis 11 is formed through the shielding cover 16, 17 and the front plates 13.

Since the shielding covers 16 and 17 are metallic and the shielding effect is provided in the shielding covers 16 and 17 themselves, the EMI radiation from the connector 15 will be reliably suppressed if the connector 15 covered by the shielding covers 16 and 17 is general connector of non-shielded type, for example made of a resin.

It is not necessary to use special connector for shielded cable for connecting the shielded cable 14 and general connector 15 is connected to the connector 13a on the front plate 13 attached on the chassis 11 of electronic equipment. The shielding sheath of the shielded cable 14 is reliably grounded to the chassis 11 at a low impedance through the front plates 13 from the gaskets 18, 19 and the shielding covers 16 and 17.

Thus noise suppressing structure 10 for the shielded cable is simple in structure comprising the shielding cover 16, 17, the gaskets 18 and 19, and the shielding layer is easily formed with low cost using general connector 15.

The noise suppressing structure 10 for the shielded cable of the embodiment of the present invention is simple in structure and can reliably shield the surround of the connector 15 at a low cost when general connector 15 is used and connects the shielded cable 14 to the connector 13a mounted on the chassis in electronic equipment. In the noise suppressing structure 10, the shielding sheath of the shielded cable 14 can be reliably grounded to the chassis 11 at a low impedance.

In the above-mentioned embodiment, the shielding covers 16 and 17 are metallic in order to keep the shielding effect. However the shielding cover 16 and 17 may be ones coated with a conductive material or made of plastic admixed with a conductive material.

In the above-mentioned embodiment, the gaskets 18 and 19 are formed to cover elastic sponge by a metallic fabric. However the gaskets 18 and 19 may be formed to cover elastic sponge by a metallic mesh etc.

In the above-mentioned embodiment, the gaskets 18 and 19 are respectively arranged to stagger back and forth. However the gaskets 18 and 19 may be respectively arranged to oppose back and forth in a registered fashion.

In the above-mentioned embodiment, the connector 13*a* in an electronic equipment is mounted on the front plate 13 attached to the front of the circuit board 12. However the connector 13*a* may be directly mounted on the chassis 11.

The meritorious effects of the present invention are summarized as follows.

Since the second connector of non-shielded type, connected to the first connector mounted on the chassis, is enclosed by the pair of conductive shielding covers, the EMI radiation from the second connector is suppressed by the shielding covers.

Since each gasket is elastically contacted and conducted at a low impedance with the shielding sheath exposed at the exposed portion of the shielded cable stretching from the second connector, the shielding sheath is grounded through the gaskets and the shielding covers.

Consequently, the connector is easily attachable and reliably shielded with a simple structure and the shielding sheath of the shielded cable is grounded at a low impedance though the general connector of non-shielded type is used to connect the shielded cable.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A noise suppressing structure for shielded cable comprising a first connector and a second connector of non-shielded type to be attached to a tip of the shielded cable, said first connector being to be mounted on a chassis of electronic equipment, said second connector being to be connected to the first connector, the structure comprising:
 a pair of conductive shielding covers which are attached to the chassis to enclose both sides of the second connector connected to the first connector and are fixed in a state to mate each other, and
 a pair of gaskets made of an elastic material are respectively attached to inside of each shielding cover and are formed of a conductive member being in electrical contact with the corresponding shielding cover, wherein each gasket is elastically contacted and conducted with a portion where a shielding sheath of the shielded cable is exposed when the shielding covers are attached to the chassis to enclose both sides of the second connector and are fixed in the state to mate each other.

2. A noise suppressing structure for shielded cable as defined in claim 1 wherein said shielding cover is made of a conductive material.

3. A noise suppressing structure for shielded cable as defined in claim 1 wherein said shielding cover has a surface made of a conductive material.

4. A noise suppressing structure for shielded cable as defined in claim 1 wherein said gaskets are arranged to stagger back and forth in a space where both of shielding covers are mated each other.

5. A noise suppressing structure for shielded cable as defined in claim 1 wherein at least one of said gaskets has a spacer in a thickness corresponding with outside diameter of the shielded cable and a spacial distance to another gasket is adjustable.

6. A noise suppressing structure for shielded cable as defined in claim 1 wherein said first connector is mounted on a circuit board in the chassis and is exposed at an outer surface of the chassis.

7. A noise suppressing structure for shielded cable as defined in claim 1 wherein said first connector is mounted on a front plate attached to a front of a circuit board installed in the chassis and is exposed at an outer surface of the chassis.

* * * * *